(12) United States Patent
Sakamoto et al.

(10) Patent No.: US 8,431,996 B2
(45) Date of Patent: Apr. 30, 2013

(54) PLASMA PROCESSING APPARATUS AND METHOD OF PRODUCING AMORPHOUS SILICON THIN FILM USING SAME

(75) Inventors: Keitaro Sakamoto, Otsu (JP); Fumiyasu Nomura, Otsu (JP); Tsunenori Komori, Otsu (JP)

(73) Assignee: Toray Industries, Inc., Tokyo (JP)

( * ) Notice: Subject to any disclaimer, the term of this patent is extended or adjusted under 35 U.S.C. 154(b) by 103 days.

(21) Appl. No.: 13/258,813

(22) PCT Filed: Mar. 15, 2010

(86) PCT No.: PCT/JP2010/054293
§ 371 (c)(1),
(2), (4) Date: Sep. 22, 2011

(87) PCT Pub. No.: WO2010/110099
PCT Pub. Date: Sep. 30, 2010

(65) Prior Publication Data
US 2012/0115314 A1     May 10, 2012

(30) Foreign Application Priority Data
Mar. 24, 2009  (JP) ................................ 2009-071385

(51) Int. Cl.
*H01L 27/01* (2006.01)
*H01L 27/12* (2006.01)
*H01L 31/0392* (2006.01)

(52) U.S. Cl.
USPC ...................... 257/350; 257/E21.09; 438/479

(58) Field of Classification Search .................. 257/350, 257/E21.09; 438/478, 479
See application file for complete search history.

(56) References Cited

U.S. PATENT DOCUMENTS
2008/0025899 A1*  1/2008  Takahashi ..................... 423/335
2009/0324827 A1*  12/2009  Miyoshi .................. 427/255.28

FOREIGN PATENT DOCUMENTS
| JP | 06124906 A | 5/1994 |
| JP | 2000012471 A | 1/2000 |
| JP | 2002299266 A | 10/2002 |
| JP | 2006237490 A | 9/2006 |
| JP | 2007214296 A | 8/2007 |

OTHER PUBLICATIONS

International Application Serial No. PCT/JP2010/054293, International Search Report mailed Jun. 15, 2010, 2 pgs.

* cited by examiner

*Primary Examiner* — Phuc Dang
(74) *Attorney, Agent, or Firm* — RatnerPrestia

(57) ABSTRACT

Disclosed is a plasma processing apparatus, wherein a plasma-generating electrode has a plurality of gas exhaust holes which run through the plasma-generating electrode from the surface facing a substrate held by a substrate-holding mechanism, and reach a gas exhaust chamber; gas-feeding pipes, provided connected to a gas-introducing pipe, have gas-feeding ports for discharging source gas toward the inside of the plurality of gas exhaust holes; and the gas-feeding pipes and the gas-feeding ports are arranged in a manner such that extended lines, representing the direction of the flow of the source gas discharged from the gas-feeding ports, intersect the end surface open regions at the interface of the gas exhaust chamber to the gas exhaust holes. Also disclosed is a method of producing the amorphous silicon thin film using the plasma processing apparatus.

10 Claims, 7 Drawing Sheets

PLASMA PROCESSING APPARATUS AND METHOD OF PRODUCING AMORPHOUS SILICON THIN FILM USING SAME

CROSS-REFERENCE TO RELATED APPLICATIONS

This application is the U.S. National Phase application of PCT International Application No. PCT/JP2010/054293, filed Mar. 15, 2010, and claims priority to Japanese Patent Application No. JP 2009-071385, filed Mar. 24, 2009, the disclosures of which PCT and priority applications are incorporated herein by reference in their entirely for all purposes.

FIELD OF THE INVENTION

The present invention relates to a plasma processing apparatus, particularly a plasma CVD apparatus for forming a thin film by chemical vapor deposition (CVD) using a plasma, and a method for producing an amorphous silicon thin-film using the apparatus.

BACKGROUND OF THE INVENTION

In recent years, under growing awareness of environmental friendliness, photovoltaic power generation attracts attention. In this situation, various solar cells have been developed, and some of them are practically used. Above all, thin-film silicon solar cells that are small in the amount of silicon used as a raw material and therefore suitable for mass production are expanding in production scale.

However, the thin-film silicon solar cells exposed to light irradiation decline in power generation efficiency with the lapse of time, and this so-called light induced degradation problem is not yet overcome. These solar cells are requested to be further improved to achieve higher energy conversion efficiency.

The amorphous silicon thin-films used in the thin-film silicon solar cells are often formed by a plasma CVD method using silane gas as a raw material. However, during film formation, unwanted materials such as higher silanes and particles secondarily produced in the plasma can be mixed into the film, and those unwanted materials in the film are considered to cause light induced degradation. The unwanted materials mixed in the film increase the Si—$H_2$ bond concentration of the film. There is a correlation between the Si—$H_2$ bond concentration of the film and the light induced degradation degree, and in order to prevent light induced degradation, it is preferred to keep the Si—$H_2$ bond concentration of the film small. Consequently in order to prevent such light induced degradation, any idea is required to be developed for preventing the unwanted materials such as higher silanes and particles from being mixed into the film.

FIG. 13 is a schematic vertical sectional view showing a conventional general plasma CVD apparatus. In a vacuum vessel P1 of a plasma CVD apparatus PA13 shown in FIG. 13, a plasma generating electrode P2 and an earth electrode P23 are disposed to face each other with a gap kept between them. One end of an exhaust pipe P1 is connected with the vacuum vessel P1, and the other end of the exhaust pipe P10 is connected with a gas exhaust device P9. The gas exhaust device P9 is used to keep the pressure in the vacuum vessel P1 low through the exhaust pipe P10. The plasma generating electrode P2 is provided with gas supply ports P16 like a shower head, and a source gas such as silane gas is fed from the gas supply ports 16 into the vacuum vessel P1. The source gas is supplied from a gas introduction pipe P14 into the gas supply ports P16. The earth electrode P23 supporting a substrate P3 is provided with a substrate heating mechanism P11, and the exhaust pipe P10 is provided with a pressure regulating valve P20.

A power supply P6 connected with the plasma generating electrode P2 supplies power to the plasma generating electrode P2, to generate a plasma P7. The generated plasma P7 decomposes the source gas, to generate a film forming species that forms a thin film on the substrate P3 held on the earth electrode P23.

As one method for removing the unwanted materials produced in the plasma processing apparatus, known is a method of sucking and removing the unwanted materials from the gas exhaust holes formed in the plasma generating electrode.

Patent Literature 1 discloses numerous exhaust holes having an inner diameter of not larger than the Debye length, which are distributed to open in the entire surface facing the substrate, of the electrode. Patent Literature 1 does not refer to the removal of unwanted materials by the numerous exhaust holes opening in the surface of the electrode, but the exhaust holes are provided to allow the equal supply of the gas onto the film forming surface and the equal exhaust of the gas from the film forming surface, for realizing uniform plasma processing and uniform film formation.

Patent Literature 2 discloses an electrode having numerous recesses and projections, in which gas supply holes are formed in either the projections or the recesses, while gas sucking holes are formed in the other.

Patent Literature 3 discloses an electrode provided with both gas introduction holes and gas exhaust holes and further having numerous recesses formed on the surface thereof. In the recesses on the surface of the electrode, a highly dense plasma is generated, and the gas introduction holes formed in the recesses are used to highly efficiently decompose the source gas. Further, the gas exhaust holes formed in the recesses allow decomposed species to be removed before the decomposed species produced in the highly dense plasma grow into higher silanes, clusters, etc. owing to reactions.

PATENT LITERATURE

Patent Literature 1: JP 6-124906 A
Patent Literature 2: JP 2006-237490 A
Patent Literature 3: JP 2007-214296 A

SUMMARY OF THE INVENTION

In the technique disclosed in Patent Literature 1, the gas supply is the same as that of an ordinary shower electrode. Therefore, the generated higher silanes and particles are carried on the flow of the supplied gas toward the substrate. Accordingly the disclosed numerous exhaust holes cannot be considered to be able to sufficiently exhibit the capability of removing the unwanted materials by the exhaust from the electrode.

In the technique disclosed in Patent Literature 2, the gas discharged from the gas supply holes directly goes toward the substrate, and accordingly the unwanted materials produced in the plasma also ride on the flow of the gas, going toward the substrate. Therefore, the disclosed gas suction holes cannot be considered to be able to sufficiently exhibit the capability of removing the unwanted materials by the exhaust from the electrode as in the case of Patent Literature 1.

In the technique disclosed in Patent Literature 3, the gas supply direction is the same as that of the conventional shower electrode, and no other idea of improvement is taken into account in this regard. Therefore, since higher silanes, etc. riding on the flow of the supplied gas fly toward the substrate, any improvement of gas flow is considered advantageous.

The invention provides a plasma processing apparatus capable of efficiently removing the unwanted materials generated in plasma processing, and also provides a method for producing a high-quality amorphous silicon thin-film small in the amount of unwanted materials such as higher silanes and particles mixed into the film, by the chemical vapor deposition (CVD) using a plasma by using the plasma processing apparatus.

A plasma processing apparatus according to embodiments of the invention is as follows.

A plasma processing apparatus comprising (a) a vacuum vessel, (b) a plasma generating electrode provided inside the vacuum vessel, (c) a substrate holding mechanism for holding a substrate positioned to face the plasma generating electrode with a gap kept against the plasma generating electrode inside the vacuum vessel, (d) a gas exhaust device connected with the vacuum vessel, which opens in a gas exhaust chamber formed between the plasma generating electrode and the inner wall surface of the vacuum vessel inside the vacuum vessel, in order to keep the pressure in the vacuum vessel at a reduced pressure, (e) a power supply connected with the plasma generating electrode, for supplying power to the plasma generating electrode, and (f) a gas introduction pipe connected with the vacuum vessel, for introducing source gas for plasma processing, into the inside of the vacuum vessel, wherein (g) the plasma generating electrode has multiple gas exhaust holes extending from the surface of the plasma generating electrode on the side facing the substrate, through the plasma generating electrode, to reach the gas exhaust chamber, in the state where the substrate is held on the substrate holding mechanism, (h) gas supply pipes connected with the gas introduction pipe have gas supply ports for discharging the source gas toward the insides of the multiple gas exhaust holes, and (i) the gas supply pipes and the gas supply ports are disposed in such a manner that the extension lines in the flow directions of the source gas discharged from the gas supply ports may intersect end face opening regions at the boundary plane between the gas exhaust holes and the gas exhaust chamber.

In the plasma processing apparatus of the invention, it is preferred that the gas exhaust chamber is provided inside the plasma generating electrode.

In the plasma processing apparatus of the invention, it is preferred that the gas supply ports are opened at the inner wall surfaces of the gas exhaust holes.

In the plasma processing apparatus of the invention, it is preferred that the gas supply pipe and the gas supply port are positioned inside the gas exhaust hole.

In the plasma processing apparatus of the invention, in the state where the substrate holding mechanism holds the substrate, a plasma confining electrode may be provided almost in parallel to the surface of the plasma generating electrode on the side facing the substrate with a gap kept against it, and the plasma confining electrode may have through holes at the positions corresponding to the multiple gas exhaust holes of the plasma generating electrode.

In the plasma processing apparatus of the invention, it is preferred that the gas supply ports are opened at the inner wall surfaces of the through holes of the plasma confining electrode.

In the plasma processing apparatus of the invention, it is preferred that the gas supply pipe and the gas supply port are positioned inside the through holes of the plasma confining electrode.

In the plasma processing apparatus of the invention, it is preferred that the plasma confining electrode has a plasma confining electrode heating mechanism and that a gas buffer space is formed inside the plasma confining electrode.

In the plasma processing apparatus of the invention, the plasma processing in the plasma processing apparatus can also be chemical vapor deposition (CVD).

A method for producing an amorphous silicon thin-film using the plasma processing apparatus is as described below.

A method for producing an amorphous silicon thin-film by using any one of the abovementioned plasma processing apparatuses, keeping the pressure in the vacuum vessel at a reduced pressure by the gas exhaust device of the plasma processing apparatus, introducing a silane-containing source gas from the gas introduction pipe, supplying power from the power supply to the plasma generating electrode, in order to generate a plasma, and decomposing the source gas by the plasma generated by the plasma generating electrode, to form an amorphous silicon thin-film on the substrate.

The invention provides a plasma processing apparatus capable of efficiently removing the unwanted materials generated by plasma processing. If the plasma processing apparatus of the invention is used as plasma CVD apparatus, the film can be formed in such an environment where unwanted materials of high molecular weights, particles and the like are prevented from being mixed into the formed film, and consequently a high-quality thin-film having few defects can be obtained. The amorphous silicon thin-film produced by using the plasma CVD apparatus is a thin film having few structural defects and little light induced degradation, since unwanted materials such as higher silanes and particles are sufficiently prevented from being mixed into the film. If the amorphous silicon thin-film is used in a solar cell, the decline of the obtained solar cell in conversion efficiency due to light induced degradation can be decreased.

DETAILED DESCRIPTION OF EMBODIMENTS OF THE INVENTION

Several embodiments of the invention are explained below in reference to the drawings.

Figure 1:
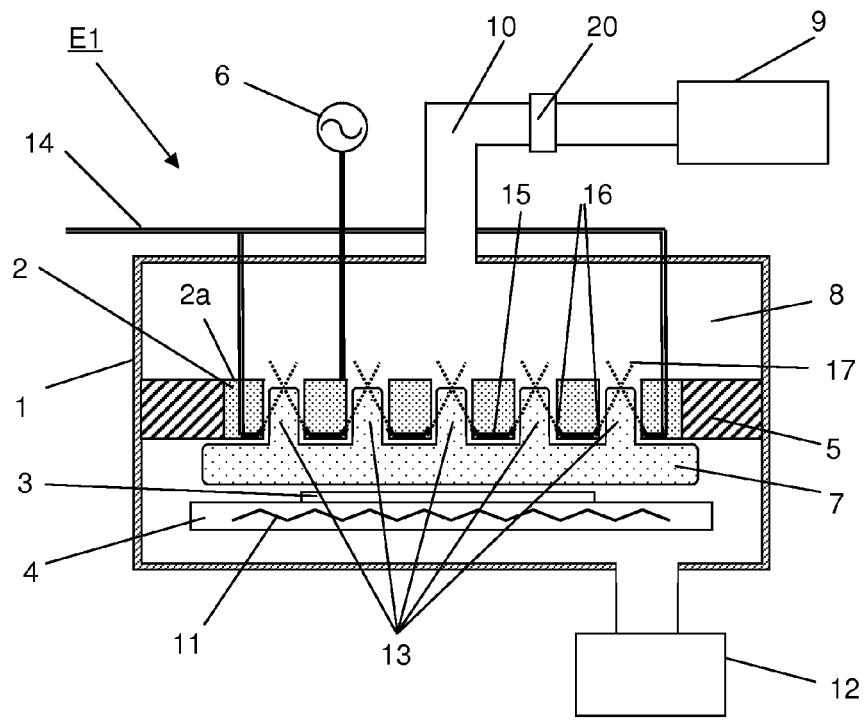
FIG. 1 is a schematic vertical sectional view showing an example of the plasma processing apparatus of the invention.

FIG. 1 is a schematic vertical sectional view showing an example of the plasma processing apparatus of the invention. In FIG. 1, a plasma processing apparatus E1 has a vacuum vessel 1. The vacuum vessel 1 is internally provided with a plasma generating electrode 2 for generating a plasma. The plasma generating electrode 2 in the plasma processing apparatus E1 is formed of an electrode plate 2a. A substrate holding mechanism 4 for holding a substrate 3 is provided in such a manner that the substrate 3 may be positioned to face the lower surface in the drawing of the electrode plate 2a with a gap kept against the electrode plate 2a. The size (area) of the surface of the electrode plate 2a on the side facing the substrate 3 is selected, considering the size of the substrate 3 attached to the substrate holding mechanism 4, to have a thin film formed thereon.

The plasma generating electrode 2 (electrode plate 2a) is fixed to the vacuum vessel 1, being electrically insulated from the vacuum vessel 1 by an insulating material 5. The plasma generating electrode 2 is connected with a power supply 6 provided outside the vacuum vessel 1. If power is supplied from the power supply 6 to the plasma generating electrode 2, a plasma 7 is generated in the vacuum vessel 1. A gas exhaust chamber 8 is formed in the inner space of the vacuum vessel 1 above the upper surface in the drawing of the electrode plate 2a. In order to keep the pressure in the vacuum vessel 1 at a reduced pressure, an exhaust pipe 10 opening at one end thereof in the gas exhaust chamber 8 and connected with a gas exhaust device 9 at the other end thereof is provided in the vacuum vessel 1.

The substrate holding mechanism 4 may be provided with a substrate heating mechanism 11 such as a heater. The vacuum vessel 1 may also be connected with an auxiliary gas exhaust device 12 different from the gas exhaust device 9.

As the power supply 6, any optional power supply such as a high frequency power supply, pulse power supply or DC power supply can be used. In the case where a high frequency power supply is used, the frequency can also be optional. A high frequency power supply of VHF band is suitable as a high frequency power supply since a low electron-temperature and high-density plasma can be easily produced. The output of the high frequency power supply can also be pulse-modified, amplitude-modified or the like.

The electrode plate 2a of the plasma generating electrode 2 has multiple gas exhaust holes 13 formed to pass through from the surface of the electrode plate 2a on the side facing the substrate 3 (the lower surface of the electrode plate 2a in the drawing) to the surface of the electrode plate 2a on the side of the gas exhaust chamber 8 (the upper surface of the electrode plate 2a in the drawing). The multiple gas exhaust holes 13 are disposed with an interval between them, that is, at a predetermined pitch on the surface of the electrode plate 2a on the side facing the substrate 3 (the lower surface of the electrode plate 2a in the drawing).

The multiple gas exhaust holes 13 passing through the electrode plate 2a are provided to allow the entry of the plasma 7 into the respective gas exhaust holes 13 and to convey and remove the unwanted materials such as higher silanes and particles produced in the gas exhaust holes 13 or entering the gas exhaust holes 13 toward the gas exhaust chamber 8 by the flow of the gas exhaust formed in the gas exhaust holes 13.

Therefore, it is preferred that the respective gas exhaust holes 13 have a sufficient size to allow the entry of the plasma 7 thereinto. Particularly, the opening size of the gas exhaust hole 13 in the surface of the electrode plate 2a of the plasma generating electrode 2 on the side facing the substrate 3 (the lower surface of the electrode plate 2a in the drawing) is only required to be such as to include the virtual circle with a radius corresponding to the Debye length of the plasma 7 produced in front of the surface of the electrode plate 2a on the side facing the substrate 3 (the lower surface of the electrode plate 2a in the drawing).

The opening form of the gas exhaust hole 13 can be selected as desired from polygons such as triangle and square, circle, ellipsis and star. However, in view of the stability of the plasma, the maintenance of the inner wall surface of the gas exhaust hole 13 and the cost for producing the electrode, a circle is preferred.

The sectional form in the depth direction of the gas exhaust hole 13, i.e., the vertical sectional form of the gas exhaust hole 13 can remain the same in diameter or can change in diameter in the depth direction while maintaining similar figures is from the surface of the electrode plate 2a of the plasma generating electrode 2 on the side facing the substrate 3 (the lower surface of the electrode plate 2a in the drawing) till reaching the gas exhaust chamber 8. For example, in the case where the cross sectional form of the gas exhaust hole 13 is circular, it is desirable that the diameter of the gas exhaust hole 13 is made smaller continuously toward the gas exhaust chamber 8 or has a certain diameter till somewhere in the depth direction and subsequently has a smaller diameter till reaching the gas exhaust chamber 8, that is, is made smaller stepwise, respectively for the purpose of preventing the plasma 7 entering the gas exhaust hole 13 from going into the gas exhaust chamber 8.

The arrangement of the multiple gas exhaust holes 13 in the electrode plate 2a of the plasma generating electrode 2 can be decided optionally. However, in view of the uniformity of the produced plasma 7 on the surface of the electrode plate 2a on the side facing the substrate 3 (the lower surface of the electrode plate 2a in the drawing), it is preferred that the multiple gas exhaust holes 13 are disposed to form a square lattice with equal intervals or a triangular lattice with equal intervals.

The source gas is introduced from a gas introduction pipe 14 into gas supply pipes 15 located in the vacuum vessel 1. However, the structure of the gas supply pipes 15 and the gas supply ports 16 as the gas discharge ends of the gas supply pipes 15 is different from that of the shower electrode employed in an ordinary CVD apparatus, etc. That is, the gas supply pipes 15 and the gas supply ports 16 are disposed to supply the gas toward the insides of the multiple gas exhaust holes 13. In addition, the gas supply pipes 15 and the gas supply ports 16 are disposed in such a manner that the extension lines 17 in the flow directions of the gas discharged from the gas supply ports 16 may intersect the end face opening regions 19 (see FIG. 3) at the boundary plane between the gas exhaust holes 13 and the gas exhaust chamber 8.

In this case, "the extension line 17 in the flow direction of gas" refers to a straight line having the direction of the final straight portion including the gas supply port 16 of the gas passage in the gas supply pipe 15 and passing through the center of the opening of the gas supply port 16. Further, "the end face opening region 19" refers to the plane closing region formed by the intersection line between the inner wall surface of the gas exhaust hole 13 and the boundary plane between the gas exhaust hole 13 and the gas exhaust chamber 8.

If all the gas supply ports 16 in the plasma generating electrode 2 are configured as described above, a state where the gas discharged from the gas supply ports 16 efficiently blows the unwanted materials such as higher silanes and particles in the gas exhaust holes 13 toward the gas exhaust chamber 8 can be formed. On the other hand, in the case where the extension lines 17 in the flow directions of the gas discharged from the gas supply ports 16 do not intersect the end opening regions 19 but collides with the wall surfaces of the gas exhaust holes 13, the flow of the discharged gas collides with the wall surfaces, to be disturbed, and as a result, the unwanted materials may flow back toward the substrate 3 as the case may be.

The gas exhaust chamber 8 is formed, for example, as a region (space) surrounded by parts of the inner wall surfaces of the vacuum vessel 1 and the upper surface in the drawing of the electrode plate 2a of the plasma generating electrode 2 as shown in FIG. 1. If the wall surfaces forming the gas exhaust chamber 8 are of the same potential, the occurrence of abnormal discharge in the gas exhaust chamber 8 can be inhibited. Therefore, it is preferred that the gas exhaust chamber 8 is formed inside the plasma generating electrode 2, that is, as a region (space) surrounded by the plasma generating electrode 2.

Figure 2:
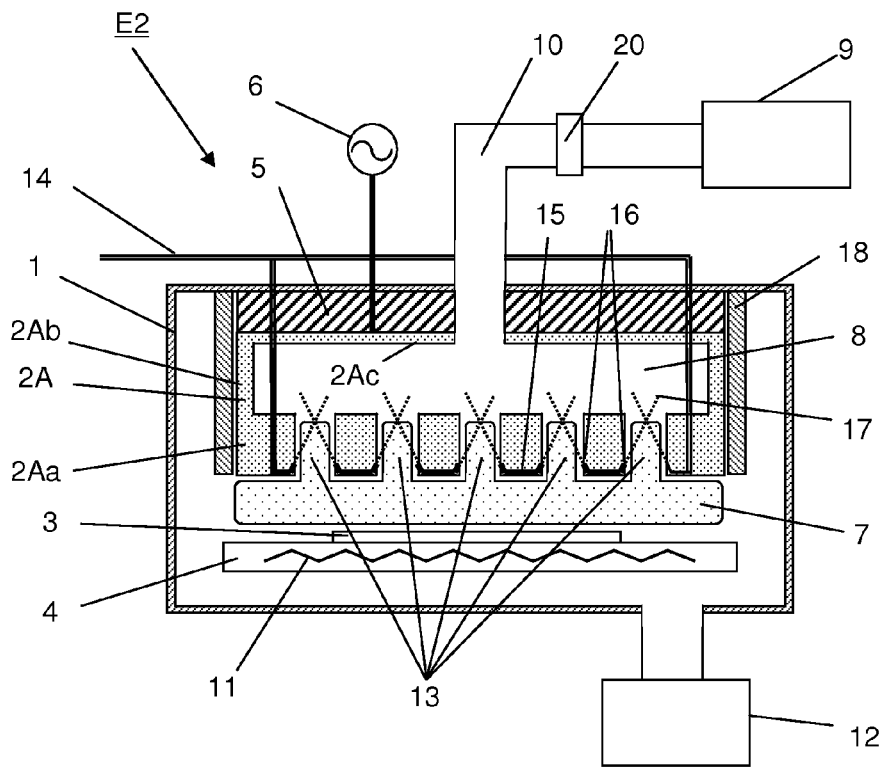
FIG. 2 is a schematic vertical sectional view showing another example of the plasma processing apparatus of the invention.

A schematic vertical sectional view showing an example of the plasma processing apparatus in which the gas exhaust chamber 8 is formed inside the plasma generating electrode 2 is shown in FIG. 2. A plasma processing apparatus E2 shown in FIG. 2 has a plasma generating electrode 2A in the vacuum vessel 1. The structure of the plasma generating electrode 2A is different from the structure of the plasma generating electrode 2 shown in FIG. 1. That is, the plasma generating electrode 2A has the gas exhaust chamber 8 therein. The plasma generating electrode 2A comprises an electrode plate 2Aa, side walls 2Ab extending from the periphery of the electrode plate 2Aa and formed of the electrode material, and a ceiling plate 2Ac connected with the side walls 2Ab, to cover the space surrounded by the side walls 2Ab, and formed of the electrode material. In other words, the plasma generating electrode 2A is a housing formed of the electrode material and has the gas exhaust chamber 8 therein.

In the plasma processing apparatus E2 of FIG. 2, the plasma generating electrode 2A is fixed to the vacuum vessel 1 via an insulating material 5. Along the lateral faces of the plasma generating electrode 2A, earth shields 18 are disposed via a gap of several millimeters. The earth shields 18 prevent the occurrence of unnecessary discharge on the lateral faces of the plasma generating electrode 2A. Since the wall surfaces of the gas exhaust chamber 8 are formed by the plasma generating electrode 2A, all the wall surfaces of the gas exhaust chamber 8 are of the same potential to prevent the generation of an electric field inside the gas exhaust chamber 8, and as a result, the occurrence of abnormal discharge inside the gas exhaust chamber 8 can be prevented.

The electrode plate 2Aa of the plasma generating electrode 2A has the same structure as that of the electrode plate 2a shown in FIG. 1. Since the other components in the plasma processing apparatus E2 of FIG. 2 are perfectly or substantially the same as the components of the plasma processing apparatus E1 of FIG. 1, the same symbols as those used in FIG. 1 are used in FIG. 2. The same applies also to other drawings.

Figure 3:
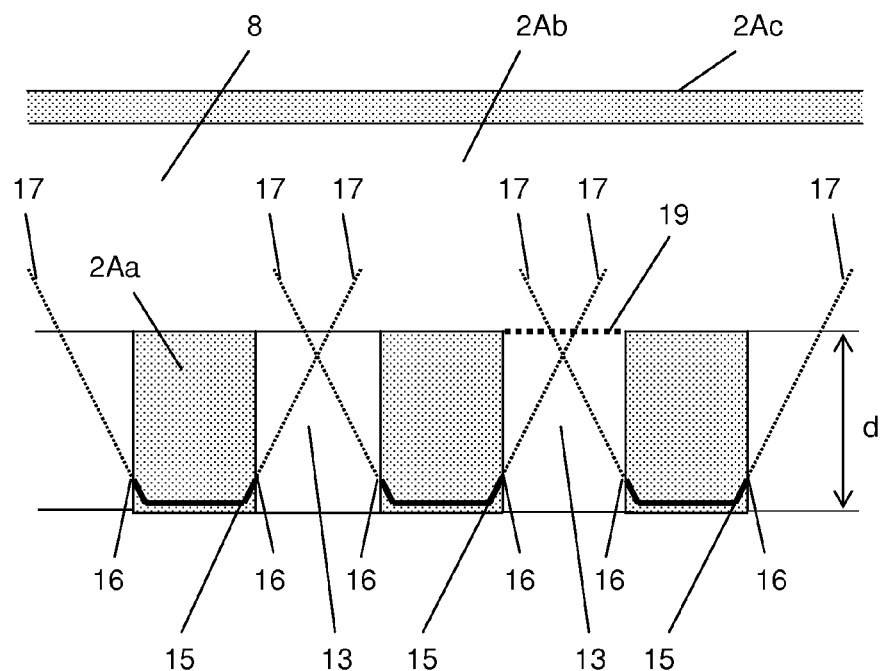
FIG. 3 is an enlarged vertical sectional view showing a portion of the plasma generating electrode of the plasma processing apparatus shown in FIG. 2.

FIG. 3 is an enlarged vertical sectional view showing a portion of the plasma generating electrode 2A of FIG. 2. FIG. 3 shows an example of the configuration of the gas supply ports 16. In FIG. 3, an example of the end face opening regions 19 is shown with a dotted line. In FIG. 3, gas supply ports 16 are formed at the inner wall surface of the gas exhaust hole 13, and the directions of the gas supply pipes 15 are set in such a manner that the extension lines 17 in the flow directions of the gas discharged from the gas supply ports 16 may intersect the end face opening region 19 at the boundary plane between the gas exhaust hole 13 and the gas discharge chamber 8.

Figure 4:
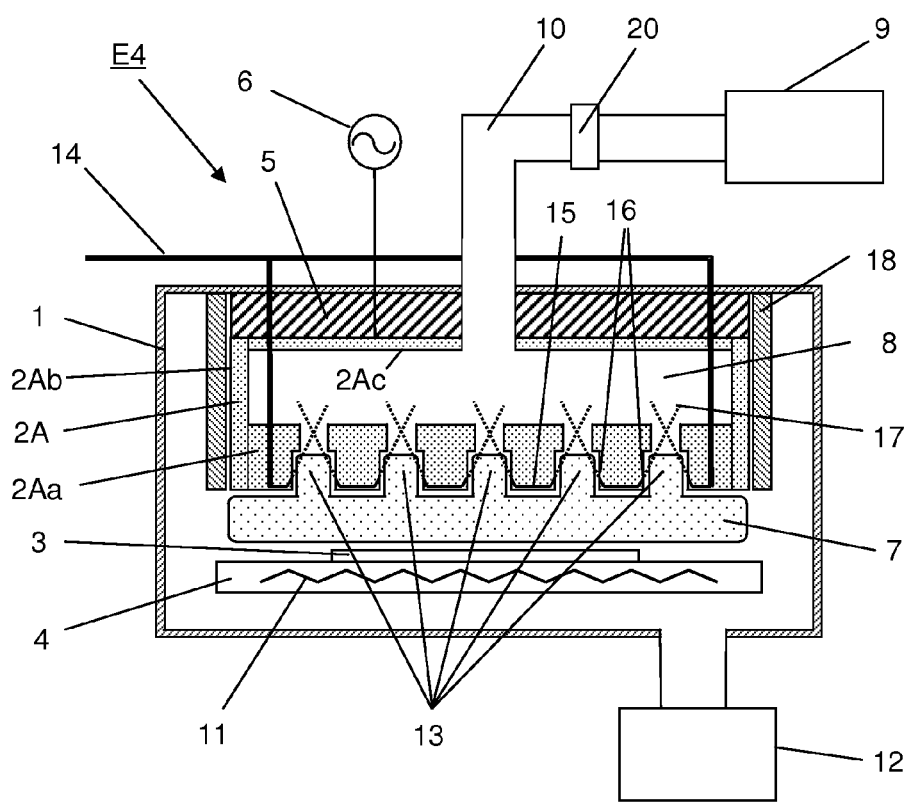
FIG. 4 is a schematic vertical sectional view showing a further other example of the plasma processing apparatus of the invention.
Figure 5:
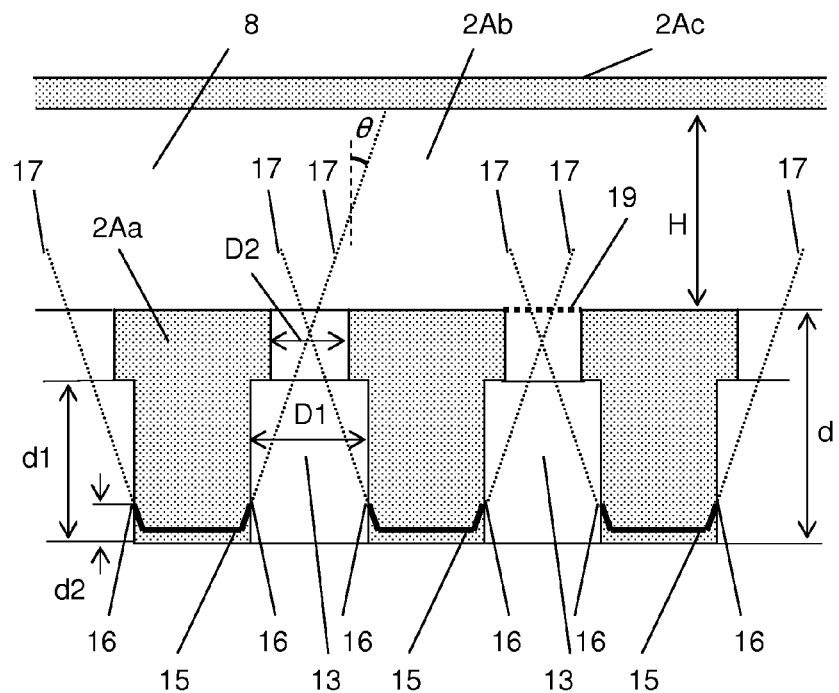
FIG. 5 is an expanded vertical sectional view showing a portion of the plasma generating electrode of the plasma processing apparatus shown in FIG. 4.

A vertical sectional view showing a further other example of the plasma processing apparatus is shown in FIG. 4. An enlarged vertical sectional view showing a portion of the plasma generating electrode of a plasma processing apparatus E4 of FIG. 4 is shown in FIG. 5. FIGS. 4 and 5 show an example of the case where the inner diameter of the gas exhaust hole 13 of the plasma processing apparatus E4 changes in the longitudinal direction (depth direction) of the gas discharge hole 13. Particularly, FIG. 5 shows gas exhaust hole 13 in which the inner diameter on the inlet side is larger than the inner diameter of the outlet side (gas exhaust chamber 8 side), that is, the inner diameter changes once stepwise. Also in this case, the directions of the gas supply pipes 15 are set in such a manner that the extension lines 17 in the flow directions of the gas discharged from the gas supply ports 16 may intersect the end face opening region 19 at the boundary plane between the gas exhaust hole 13 and the gas exhaust chamber 8.

Figure 6:
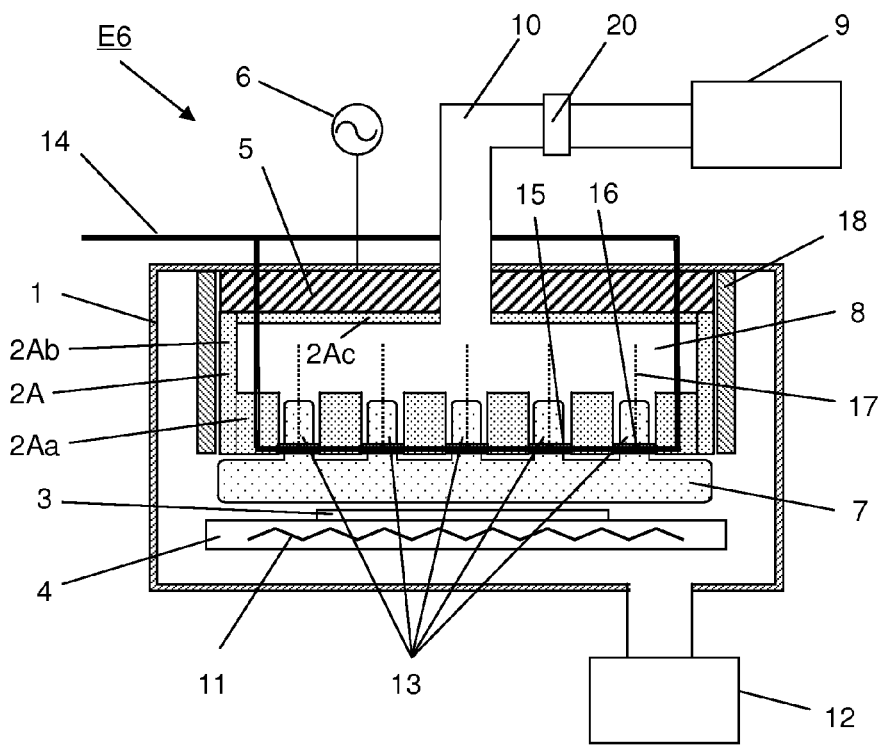
FIG. 6 is a schematic vertical sectional view showing a further other example of the plasma processing apparatus of the invention.
Figure 7:
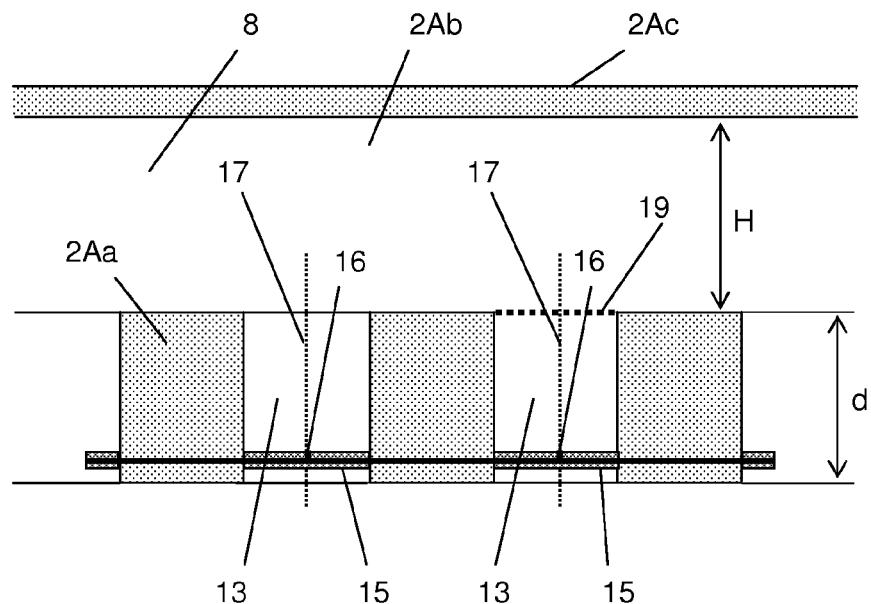
FIG. 7 is an expanded vertical sectional view showing a portion of the plasma generating electrode of the plasma processing apparatus shown in FIG. 6.

A vertical sectional view showing a further other example of the plasma processing apparatus is shown in FIG. 6. An enlarged vertical sectional view showing a portion of the plasma generating electrode of a plasma processing apparatus E6 of FIG. 6 is shown in FIG. 7. In the plasma processing apparatus E6 of FIGS. 6 and 7, the gas supply pipes 15 are provided to pass through the insides of the gas exhaust holes 13. Gas supply ports 16 are formed in the pipe wall of the gas supply pipes 15 at positions corresponding to halfway in the respective gas exhaust holes 13. The gas is blown from the gas supply port 16 into the gas exhaust hole 13 in such a manner that the gas may pass through the gas exhaust hole 13 to reach the gas exhaust chamber 8.

In FIGS. 6 and 7, "the final straight portion including the gas supply port 16 of the gas passage in the gas supply pipe 15" in the extension line 17 in the flow direction of gas refers to the straight line portion in the wall thickness direction of the gas supply pipe 15, through the through hole formed in the pipe wall of the gas supply pipe 15. If the gas supply pipe 15 and the gas supply port 16 are provided inside the gas exhaust hole 13 as described above, the degree of freedom in adjusting the flow direction of gas increases. Further, the form of the gas supply port 16 can be finely worked, and the form of the gas supply port 16 with more effective gas blow characteristics can be selected.

In FIGS. 3, 5 and 7, and further in FIGS. 9 and 11 described later, the depth (the length in the longitudinal direction) of the gas exhaust hole 13 is referred to as depth (length) d. The range of the depth d of the gas exhaust hole 13 is not especially limited. However, if the depth is too small, the unwanted materials fed into the gas exhaust chamber 8 may flow back toward the substrate 3. Further, in order to prevent that the plasma 7 enters the gas exhaust chamber 8, it is desired that the depth is large to some extent. On the other hand, if the depth is too large, the exhaust conductance by the gas exhaust hole 13 may become small to lower the exhaust capability. Consequently it is preferred that the depth d of the gas exhaust hole 13 is 10 mm to 60 mm. A more preferred range is 20 mm to 40 mm.

In the case where the gas supply port 16 is formed at the inner wall surface of the gas exhaust hole 13, the position of the gas supply port 16 in the depth direction of the gas exhaust hole 13 can be selected as appropriate. However, since the plasma in the gas exhaust hole 13 is strongly produced on the side of the substrate 3 in the gas exhaust hole 13, it is preferred that the gas supply port 16 is formed at a depth position closer to the substrate 3 in the gas exhaust hole 13 as far as possible. It is preferred that the position is within 10 mm from the surface of the plasma generating electrode 2, 2A on the side of the substrate 3 in the depth direction of the gas exhaust hole 13. A depth position within 5 mm is more preferred.

It is desirable that the gas exhaust chamber 8 has a sufficiently large space compared with the gas exhaust holes 13 in view of preventing that the unwanted materials fed into the gas exhaust chamber 8 flows back toward the side of the substrate 3. It is preferred that the height H of the gas exhaust chamber 8 viewed in the depth direction of the gas exhaust holes 13 is 20 mm or more and not less than the depth d of the gas exhaust holes 13. Further, it is preferred that the inner diameter of the exhaust pipe 10 connecting the gas exhaust chamber 8 with the gas exhaust device 9 is as large as possible, in view of securing the exhaust capability. As the exhaust pipe 10, multiple pipes can also be provided in parallel. In order to adjust the pressure in the vacuum vessel 1, it is preferred that a pressure regulating valve 20 is provided halfway in the exhaust pipe 10.

Figure 8:
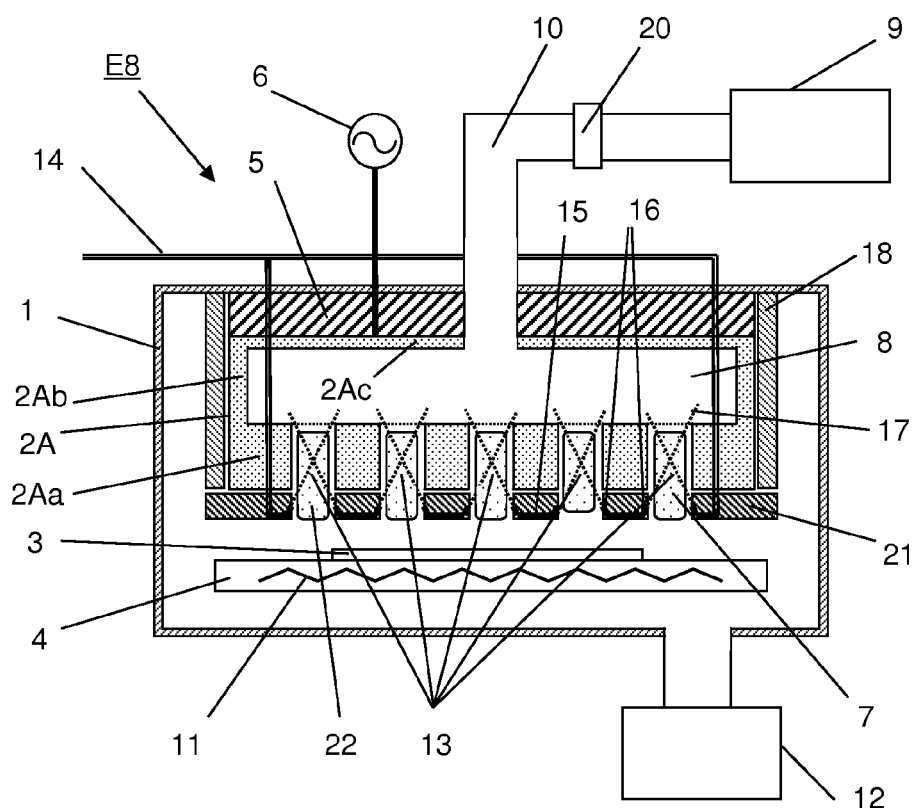
FIG. 8 is a schematic vertical sectional view showing a further other example of the plasma processing apparatus of the invention.

FIG. 8 is a schematic vertical sectional view showing a further other example of the plasma processing apparatus of the invention. In a plasma processing apparatus E8 of FIG. 8, the plasma generating electrode 2A is fixed to the vacuum vessel 1 via the insulating material 5. Along the lateral surfaces of the plasma generating electrode 2A, the earth shields 18 are disposed via a gap of several millimeters. The earth shields 18 prevent the unnecessary occurrence of discharge on the lateral faces of the plasma generating electrode 2A. A plasma confining electrode is 21 is provided on the side of the surface facing the substrate 3, of the electrode plate 2Aa of the plasma generating electrode 2A.

The plasma confining electrode 21 has through holes 22 at the positions facing the multiple gas exhaust holes 13 of the electrode plate 2Aa of the plasma generating electrode 2A. If the plasma confining electrode 21 is used, the place where the plasma is generated can be restricted within the gas exhaust holes 13, and the plasma generated in the space between the plasma confining electrode 21 and the substrate 3 can be weakened or the plasma can be prevented from being generated in the space between the plasma confining electrode 21 and the substrate 3. With this configuration, the chance that the unwanted materials generated in the plasma reaches the surface of the substrate 3 can be sharply decreased.

The plasma confining electrode 21 is disposed almost in parallel to the electrode plate 2Aa of the plasma generating electrode 2A, with a gap kept between them. If the gap between the electrode plate 2Aa of the plasma generating electrode 2A and the plasma confining electrode 21 is too narrow, short-circuit due to the film or the like deposited on the electrode or abnormal discharge may occur. Further, if the gap is too wide, an unnecessary plasma may be generated in the space between the electrode plate 2Aa of the plasma generating electrode 2A and the plasma confining electrode 21. Accordingly it is preferred that is the gap between the electrode plate 2Aa of the plasma generating electrode 2A and the plasma confining electrode 21 is 0.3 mm to 5 mm. A more preferred range is 0.5 mm to 3 mm, and a furthermore preferred range is 0.8 mm to 1.5 mm.

The potential of the plasma confining electrode 21 can be selected as desired depending on the situation. However, it is preferred that the potential of the plasma confining electrode 21 is the ground potential for such reasons that the electrode structure is simple and that the plasma can be stably confined. As for the method, for example, the plasma confining electrode 21 is connected and fixed to the earth shield 18, or the plasma confining electrode 21 is connected and fixed to the wall surface of the vacuum vessel 1. Further the plasma confining electrode 21 can be fixed while being electrically insulated from the earth shields 18 and the vacuum vessel 1 and can be connected to a power supply not shown in the drawing, and an optional potential can be applied to the plasma confining electrode 21, to control the plasma confining state.

Figure 9:
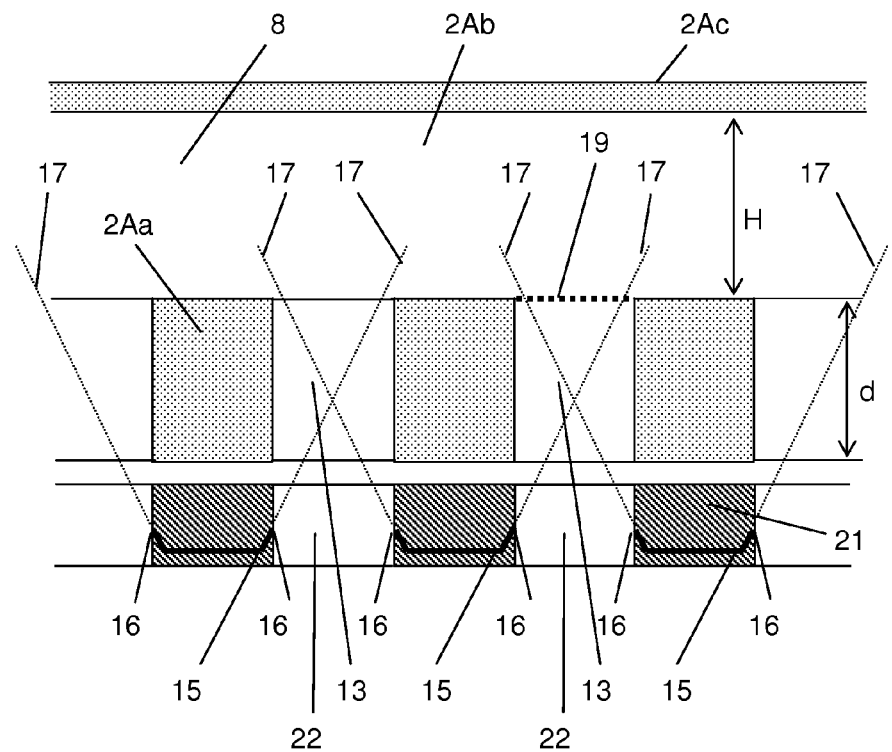
FIG. 9 is an expanded vertical sectional view showing a portion of the plasma generating electrode of the plasma processing apparatus shown in FIG. 8.

FIG. 9 is an enlarged vertical sectional view showing a portion of the electrode plate 2Aa of the plasma generating electrode 2A and the plasma confining electrode 21 of FIG. 8. In FIG. 9, the gas supply ports (16) are formed at the inner wall surface of the through hole 22 of the plasma confining electrode 21, to supply the gas from the plasma confining electrode 21, so that a stronger gas flow to the plasma can be formed from the side of the substrate 3 compared with the case where the gas supply ports 16 are formed at the inner wall surface of the gas exhaust hole 13 of the electrode plate 2Aa of the plasma generating electrode 2A. This configuration is preferred in view of the unwanted material exhaust efficiency.

Figure 10:
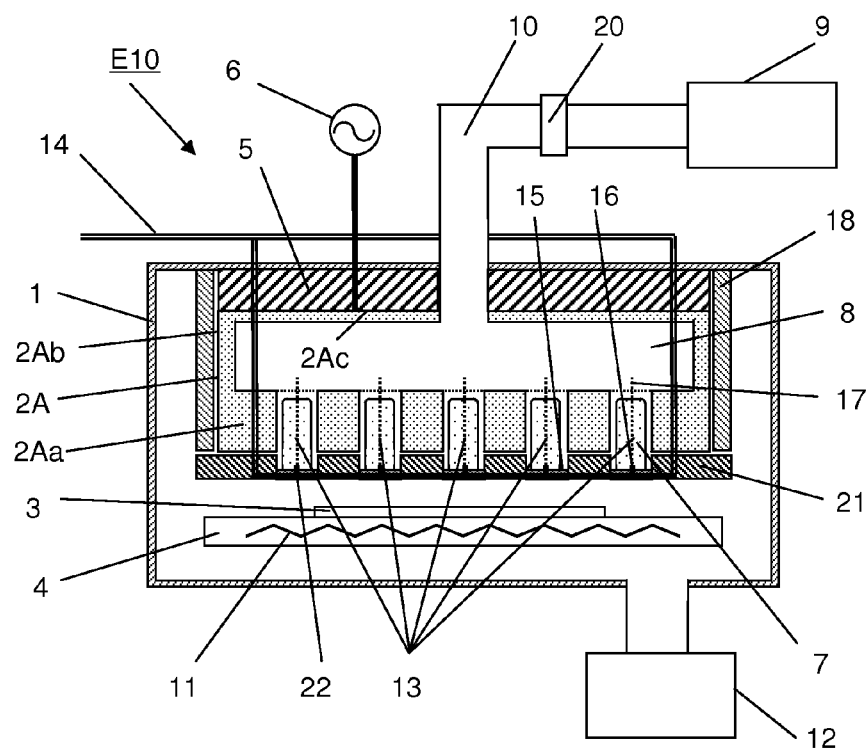
FIG. 10 is a schematic vertical sectional view showing a further other example of the plasma processing apparatus of the invention.

FIG. 10 shows a vertical sectional view showing a further other example of the plasma processing apparatus. A plasma processing apparatus E10 of FIG. 10 presents another mode of the case where the gas is supplied from the plasma confining electrode 21. FIG. 11 is an enlarged vertical sectional view showing a portion of the electrode plate 2Aa of the plasma generating electrode 2A and the plasma confining electrode 21 of FIG. 10. In FIG. 11, the gas supply pipes 15 are provided inside the through holes 22 of the plasma confining electrode 21, and the gas supply ports 16 are formed in the pipe wall of the gas supply pipes 15. The extension lines 17 in the flow directions of gas are set to pass through the through holes 22 toward the gas exhaust holes 13. If the gas supply pipes 15 and the gas supply ports 16 are provided inside the through holes 22 of the plasma confining electrode 21, the degree of freedom in adjusting the flow direction of the gas increases. Further, the form of the gas supply ports 16 can be finely worked, and the form of the gas supply ports 16 with more effective gas blow characteristics can be selected.

Figure 12:
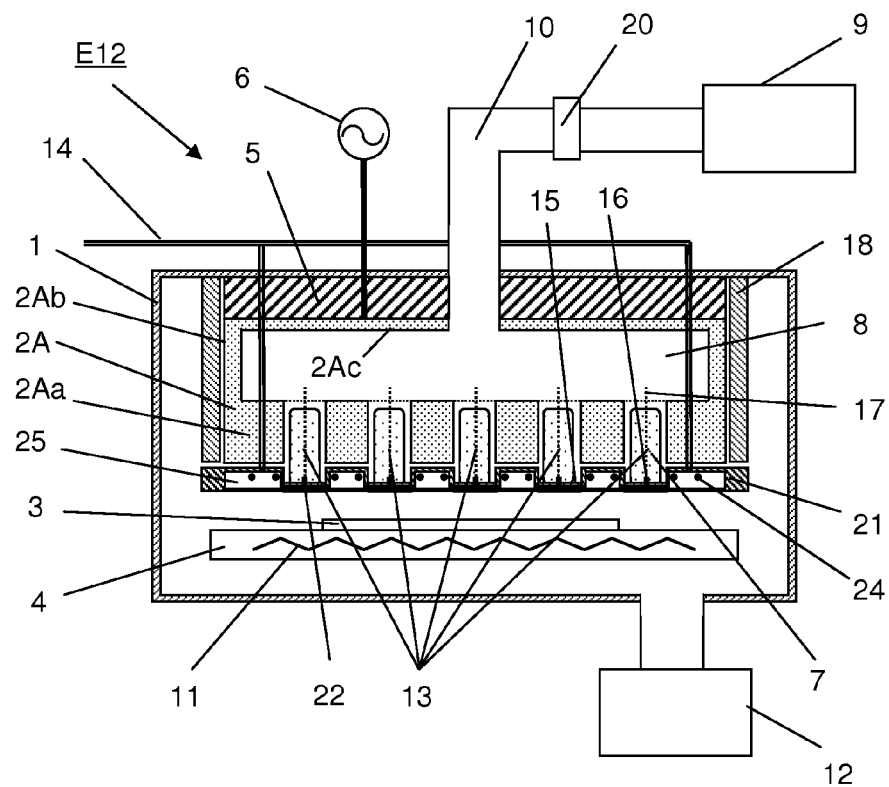
FIG. 12 is a schematic vertical sectional view showing a further other example of the plasma processing apparatus of the invention.

FIG. 12 is a schematic vertical sectional view showing a further other example of the plasma processing apparatus of the is invention. In a plasma processing apparatus E12 of FIG. 12, the plasma confining electrode 21 is provided with a plasma confining electrode heating mechanism 24. As the plasma confining electrode heating mechanism 24, an optional heating means such as a resistance heater, heating medium communication pipe or infrared lamp can be used. In view of easy electrode assembly and temperature controllability, it is preferred to use a resistance heater. The optimum heating temperature depends on the process to be performed, but a preferred temperature range is about 100° C. to about 350° C.

The plasma confining electrode 21 is internally provided with a gas buffer space 25. The gas buffer space 25 is disposed halfway in the gas supply pipe 15 installed inside the plasma confining electrode 21, and the gas that flows in can be temporarily retained in the space. If the plasma confining electrode 21 is provided with the plasma confining electrode heating mechanism 24 and the gas buffer space 25 as described above, the gas can be effectively heated while the gas passes through the plasma confining electrode 21. The gas heating can provide such effects as higher reaction efficiency and inhibited formation of unwanted materials.

The plasma processing apparatus of the invention can be used as any of various plasma processing apparatuses for film formation, etching, surface treatment, etc. Especially the plasma processing apparatus exhibits its performance in any process where unwanted byproducts are formed during processing. For example, in the dry etching using a halogen gas, film peeling during processing and the induced degradation of an internal structure can generate particles, to adversely affect the process, and therefore the plasma processing apparatus of the invention can be used as a means for removing such particles. In particular, the plasma processing apparatus of the invention can be suitably used as a plasma CVD apparatus. In plasma CVD, it is difficult to restrict the reactions of the active species produced in the plasma to the surface only of the film being formed, and the binding reactions of the active species in the vapor phase cannot be avoided, unwanted materials such as fine particles being likely to be generated. In this situation, the plasma processing apparatus of the invention can exhibit a remarkable effect of removing unwanted materials.

Next, the method for producing an amorphous silicon thin-film using the abovementioned plasma CVD apparatus will be explained below. The plasma CVD apparatus as the plasma processing apparatus of the invention can effectively prevent that the higher silanes and particles generated in the process of forming an amorphous silicon thin-film on a substrate are mixed into the thin film, to effectively prevent the decline of the film quality caused by the mixing of the higher silanes and particles into the thin film. Thus, the plasma CVD apparatus especially effectively functions to produce a high-quality amorphous silicon thin-film. Several particular examples of the method for producing a high-quality amorphous silicon thin-film will be explained below.

A first embodiment for forming an amorphous silicon thin-film is a method for producing an amorphous silicon thin-film using the plasma processing apparatus E4 shown in FIG. 4. The cross sectional form of the gas exhaust holes 13 formed in the electrode plate 2Aa of the plasma generating electrode 2A is circular, and the depth d is 20 mm. The electrode plate 2Aa is a square electrode plate having a side length of 185 mm.

On the surface of the electrode plate 2Aa, 81 gas exhaust holes 13 are disposed in a square lattice at a pitch of 17 mm. The diameter of the gas exhaust holes 13 is smaller on the side of the gas exhaust chamber 8 as shown in FIG. 5. The depth d1 of the gas exhaust holes 13 is 15 mm, and the diameter D1 of the gas exhaust holes 13 on the inlet side is 10 mm, while the diameter D2 of the gas exhaust holes 13 on the outlet side is 6 mm.

The gas supply ports 16 are formed at a position of 3 mm as the depth d2 from the surface of the electrode plate 2Aa on the side of the substrate 3, and the inner diameter of the gas supply pipes 15 reaching the gas supply ports 16 is 0.5 mm. The length direction of the gas supply pipes 15 inclines in such a manner that the angle $\theta$ with respect to the normal direction to the main flat surface forming the electrode plate 2Aa may become 20 degrees. In each of the gas exhaust holes 13, four gas supply ports 16 are provided at equal intervals in the circumferential direction. The gas supply ports 16 are disposed in such a manner that the extension lines 17 in the flow directions of the gas discharged from the gas supply ports 16 may intersect the end face opening regions 19 at the boundary plane between the gas exhaust holes 13 and the gas exhaust chamber 8. The height H of the gas exhaust chamber 8 (the distance between the electrode plate 2Aa and the ceiling plate 2Ac is 35 mm.

The plasma processing apparatus E4 as described above is used to form an amorphous silicon thin-film on a glass substrate. The glass substrate 3 is set on the substrate holding mechanism 4 of the plasma processing apparatus E4, and the substrate heating mechanism 11 is used to heat the substrate 3. The auxiliary gas exhaust device 12 is used to sufficiently exhaust the gas in the vacuum vessel 1, that is, the pressure in the vacuum vessel 1 is reduced to such a level as to allow desired plasma processing. Subsequently the exhaust operation by the auxiliary gas exhaust device 12 is replaced by the exhaust operation by the gas exhaust device 9.

Silane gas as the source gas is introduced from the gas introduction pipe 14, and the pressure-regulating valve 20 is used to regulate the pressure in the vacuum vessel 1. Power is supplied from the power supply 6 to the plasma generating electrode 2A, to generate a plasma in the vacuum vessel 1, for decomposing the source gas, thereby forming an amorphous silicon thin-film on the substrate 3.

The amorphous silicon thin-film formed on the substrate 3 as described above is very low in the defect density thereof and good in electric properties. Especially in the case where the amorphous silicon thin-film is applied to a power generation layer of a solar cell, the solar cell obtained can be small in the light induced degradation of the film and high in the photoelectric conversion efficiency.

The source gas in this case is only required to be a gas containing at least silane gas, and 100% silane gas can be used or silane gas obtained by diluting silane gas with hydrogen or a rare gas such as argon can also be used.

A second embodiment for forming an amorphous silicon thin-film is a method for producing an amorphous silicon thin-film using the plasma processing apparatus E6 shown in FIG. 6. The cross sectional form of the gas exhaust holes 13 formed in the electrode plate 2Aa of the plasma generating electrode 2A is circular. The diameter D1 of the gas exhaust holes 13 is 10 mm, and the depth d is 30 mm. The electrode plate 2Aa is a square electrode plate having a side length of 185 mm.

In the surface of the electrode plate 2Aa, 81 gas exhaust holes 13 are disposed in a square lattice at a pitch of 17 mm. A gas supply pipes 15 are provided to pass through the gas exhaust holes 13 in the direction perpendicular to the central axes of the gas exhaust holes 13 (that is, in the horizontal direction in the drawing). The outer diameter of the gas supply pipes 15 is 3 mm, and the inner diameter is 1.5 mm. The gas supply ports 16 are the holes formed in the pipe wall of the gas supply pipes 15 at near the central axes of the gas exhaust holes 13. The diameter of the gas supply ports 16 is 0.5 mm. The gas supply ports 16 are disposed in such a manner that the extension lines 17 in the flow directions of the gas discharged from the gas supply ports 16 may intersect the end face opening regions 19 at the boundary plane between the gas exhaust holes 13 and the gas exhaust chamber 8. In this configuration, the gas discharged from the gas supply ports 16 reaches the gas exhaust chamber 8 without colliding with the wall surfaces of the gas exhaust holes 13. The height H of the gas exhaust chamber 8 (the distance between the electrode plate 2Aa and the ceiling plate 2Ac) is 30 mm.

The plasma processing apparatus E6 as described above is used to form an amorphous silicon thin-film on a glass substrate. The glass substrate 3 is set on the substrate holding mechanism 4 of the plasma processing apparatus E6, and the substrate heating mechanism 11 is used to heat the substrate 3. The gas exhaust device 9 is used to exhaust the gas in the vacuum vessel 1, that is, the pressure in the vacuum vessel 1 is reduced to such a level as to allow desired plasma processing. Subsequently silane gas as the source gas is introduced from the gas introduction pipe 14, and the pressure regulating valve 20 is used to regulate the pressure in the vacuum vessel 1. Power is supplied from the power supply 6 to the plasma generating electrode 2A, to produce a plasma in the vacuum vessel 1, for decomposing the source gas, thereby forming an amorphous silicon thin-film on the substrate 3.

The amorphous silicon thin-film formed on the substrate 3 as described above is also very low in the defect density thereof as in the first embodiment.

A third embodiment for forming an amorphous silicon thin-film is a method for producing an amorphous silicon thin-film using the plasma processing apparatus E8 shown in FIG. 8. The cross sectional form of the gas exhaust holes 13 formed in the electrode plate 2Aa of the plasma generating electrode 2A is circular. The diameter D1 of the gas exhaust holes is 10 mm, and the depth d is 30 mm. The electrode plate 2Aa is a square electrode having a side length of 185 mm.

In the surface of the electrode plate 2Aa, 81 gas exhaust holes 13 are disposed in a square lattice at a pitch of 17 mm. A plasma confining electrode 21 is provided on the side of the surface facing the substrate, of the electrode plate 2Aa. The plasma confining electrode 21 is provided with through holes 22 at the positions facing the multiple gas exhaust holes 13 of the electrode plate 2Aa. The diameter of the through holes 22 is 10 mm. The thickness of the plasma confining electrode 21 is 15 mm. The gap between the plasma confining electrode 21 and the electrode plate 2Aa is 1 mm.

The plasma confining electrode 21 is fixed to the earth shields 18 for assuring electric conduction, to have the ground potential. The gas supply pipes 15 extended from the gas introduction pipe 14 are partially embedded in the plasma confining electrode 21. The tips of the gas supply pipes 15 embedded in the plasma confining electrode 21 open at the inner wall surfaces of the through holes 22, to form gas supply ports 16. The gas supply ports 16 are disposed in such a manner that the extension lines 17 in the flow directions of the gas discharged from the gas supply ports 16 may pass inside the through holes 22 of the plasma confining electrode 21 and the exhaust gas holes 13 of the electrode plate 2Aa, to intersect the end face opening regions 19 at the boundary plane between the gas exhaust holes 13 and the gas exhaust chamber 8, to reach the gas exhaust chamber 8. The height H of the gas exhaust chamber 8 (the distance between the electrode plate 2Aa and the ceiling plate 2Ac) is 30 mm.

The plasma processing apparatus E8 as described above is used to form an amorphous silicon thin-film on a glass substrate. The glass substrate 3 is set on the substrate holding mechanism 4 of the plasma processing apparatus E8, and the substrate heating mechanism 11 is used to heat the substrate 3. The gas exhaust device 9 is used to exhaust the gas in the vacuum vessel 1, that is, the pressure in the vacuum vessel 1 is reduced to such a level as to allow desired plasma processing. Subsequently silane gas as the source gas is introduced from the gas introduction pipe 14, and the pressure regulating valve 20 is used to regulate the pressure in the vacuum vessel 1. Power is supplied from the power supply 6 to the plasma generating electrode 2A, to produce a plasma in the vacuum vessel 1, for decomposing the source gas, thereby forming an amorphous silicon thin-film on the substrate 3.

The amorphous silicon thin-film formed on the substrate 3 as described above is very low in the defect density thereof, to show a further better result than those of the first embodiment and the second embodiment.

A fourth embodiment for forming an amorphous silicon thin-film is a method for producing an amorphous silicon thin-film using the plasma processing apparatus E10 shown in FIG. 10. The cross sectional form of the gas exhaust holes 13 formed in the electrode plate 2Aa of the plasma generating electrode 2A is circular. The diameter D1 of the gas exhaust holes is 10 mm, and the depth d is 30 mm. The electrode plate 2Aa is a square electrode having a side length of 185 mm.

In the surface of the electrode plate 2Aa, 81 gas exhaust holes 13 are disposed in a square lattice at a pitch of 17 mm. A plasma confining electrode 21 is provided on the side of the surface facing the substrate, of the electrode plate 2Aa. The plasma confining electrode 21 is provided with through holes 22 at the positions facing the multiple gas exhaust holes 13 of the electrode plate 2Aa. The diameter of the through holes 22 is 10 mm. The thickness of the plasma confining electrode 21 is 15 mm. The gap between the plasma confining electrode 21 and the electrode plate 2Aa is 1 mm.

The plasma confining electrode 21 is fixed to the earth shields 18 for assuring electric conduction, to have the ground potential. The gas supply pipes 15 extended from the gas introduction pipe 14 are partially embedded in the plasma confining electrode 21. The gas supply pipes 15 embedded in the plasma confining electrode 21 further extend to pass through the through holes 22 and further through the plasma confining electrode 21 again. The outer diameter of the gas supply pipes 15 is 3 mm, and the inner diameter is 1.5 mm.

The portions passing through the through holes 22, of the gas supply pipes 15 are provided in the direction perpendicular to the central axes of the gas exhaust holes 13 (that is, in the horizontal direction in the drawing). The gas supply ports 16 are the holes formed in the pipe wall of the gas supply pipes 15 near the central axes of the gas exhaust holes 13. The diameter of the gas supply ports 16 is 0.5 mm. The gas supply ports 16 are disposed in such a manner that the extension lines 17 in the flow directions of the gas discharged from the gas supply ports 16 may pass inside the through holes 22 of the plasma confining electrode 21 and the exhaust gas holes 13 of the electrode plate 2Aa, to intersect the end face opening regions 19 at the boundary plane between the gas exhaust holes 13 and the gas exhaust chamber 8, to reach the gas exhaust chamber 8. The height H of the gas exhaust chamber 8 (the distance between the electrode plate 2Aa and the ceiling plate 2Ac) is 30 mm.

The plasma processing apparatus E10 as described above is used to form an amorphous silicon thin-film on a glass substrate. The glass substrate 3 is set on the substrate holding mechanism 4 of the plasma processing apparatus E10, and the substrate heating mechanism 11 is used to heat the substrate 3. The gas exhaust device 9 is used to exhaust the gas in the vacuum vessel 1, that is, the pressure in the vacuum vessel 1 is reduced to such a level as to allow desired plasma processing. Subsequently silane gas as the source gas is introduced from the gas introduction pipe 14, and the pressure regulating valve 20 is used to regulate the pressure in the vacuum vessel 1. Power is supplied from the power supply 6 to the plasma generating electrode 2A, to produce a plasma in the vacuum vessel 1, for decomposing the source gas, thereby forming an amorphous silicon thin-film on the substrate 3.

The amorphous silicon thin-film formed as described above is very low in the defect density thereof like that formed in the third embodiment.

Example 1

The plasma processing apparatus E4 shown in FIGS. 4 and 5 was used to form an amorphous silicon thin-film on a substrate on the basis of the abovementioned first embodiment for forming an amorphous silicon thin-film, and the Si—H$_2$ bond concentration of the formed thin-film was obtained. The quality of the formed thin-film was evaluated on the basis of the concentration.

As the substrate 3, monocrystalline silicon was used. The substrate 3 was set on the substrate holding mechanism 4, and the substrate heating mechanism 11 was used to heat the substrate 3 to a temperature of 220° C. The auxiliary gas exhaust device 12 was used to exhaust the gas in the vacuum vessel 1 till the pressure in the vacuum vessel 1 became $1 \times 10^{-4}$ Pa or less, and subsequently the operation of exhausting the gas in the vacuum vessel 1 was switched from the auxiliary gas exhaust device 12 to the gas exhaust device 9. As the source gas, 300 sccm of silane gas was introduced from the gas introduction pipe 14 and supplied through the gas supply pipes 15 into the gas supply ports 16, and the pressure regulating valve 20 was used to regulate the pressure in the vacuum vessel 1 to 30 Pa. As the power supply 6, a high frequency power supply of frequency 60 MHz was used to supply power of 50 W to the plasma generating electrode 2A, for generating a plasma, thereby forming an amorphous silicon thin-film on the substrate 3.

The Si—H$_2$ bond concentration in the formed amorphous silicon thin-film was obtained by FT-IR measurement. For the FT-IR measurement, FT-720 produced by HORIBA was used. The resolution in the measurement was set at 4 cm$^{-1}$, and 16 accumulated scans were performed. The Si—H$_2$ bond concentration was obtained according to the following procedure.

From the peaks near 2000 cm$^{-1}$, the peak of 2090 cm$^{-1}$ was separated using the Gaussian function shown in formula 1. In formula 1, h denotes the peak height; a denotes the peak width; and $\omega_p$ denotes the peak wave number.

$$f(\omega) = \frac{h}{\sqrt{2\pi}\,\sigma} \exp\left(-\frac{(\omega - \omega_p)^2}{2\sigma^2}\right) \quad \text{(Formula 1)}$$

Then, from the separated peak, the bound hydrogen concentration N$_{H2}$ was obtained on the basis of formula 3, using the absorption coefficient α calculated from formula 2.

In formula 2, Ts denotes the transmittance of monocrystalline silicon (%); ΔT denotes the transmittance of the amorphous silicon thin-film of the baseline (%); and d denotes the film thickness (cm). In formula 3, ω denotes the wave number (cm$^{-1}$); and A denotes proportionality constant $1.4 \times 10^{20}$ cm$^{-2}$.

$$\alpha = \frac{1}{d} \ln\left\{ \frac{-2Ts + \sqrt{4Ts^2 + (1-Ts)^2(1+Ts)^2(\Delta T)^2}}{(1-Ts)2\Delta T} \right\} \quad \text{(Formula 2)}$$

$$N_{H2} = A \times \int \frac{\alpha(\omega)}{\omega} d\omega \ (\text{cm}^{-3}) \quad \text{(Formula 3)}$$

Then, Si atom number density being approximated by $5.0 \times 10^{22}$ cm$^{-3}$, the N$_{H2}$ obtained from formula 3 was used to calculate Si—H$_2$ bond density C$_{H2}$ on the basis of formula 4.

$$C_{H2} = \frac{N_{H2}}{5.0 \times 10^{22}} \times 100(\%) \quad \text{(Formula 4)}$$

As a result, the Si—H$_2$ bond concentration of the formed amorphous silicon thin-film was 0.7%, and it was confirmed that the formed amorphous silicon thin-film was low in the defect density thereof.

Example 2

An amorphous silicon thin-film was formed on a substrate using the plasma processing apparatus E6 shown in FIGS. 6 and 7 on the basis of the abovementioned second embodiment for forming an amorphous silicon thin-film, according to the same procedure as that in Example 1. The Si—H$_2$ bond concentration of the formed amorphous silicon thin-film was calculated on the basis of the same method as that of Example 1. As a result, the Si—H$_2$ bond concentration of the formed amorphous silicon thin-film was 0.6%, and it was confirmed that the amorphous silicon thin-film was low in the defect density thereof.

Example 3

An amorphous silicon thin-film was formed on a substrate according to the same procedure as that of Example 1, except that the plasma processing apparatus E8 shown in FIGS. 8 and 9 was used on the basis of the abovementioned third embodiment for forming an amorphous silicon thin-film, and that power of 80 W was supplied to the plasma generating electrode 2A. The Si—H$_2$ bond concentration of the formed amorphous silicon thin-film was calculated on the basis of the same method as that of Example 1. As a result, the Si—H$_2$ bond concentration of the formed amorphous silicon thin-film was 0.3%, and it was confirmed that the formed amorphous silicon thin-film was low in the defect density thereof.

Example 4

Figure 11:
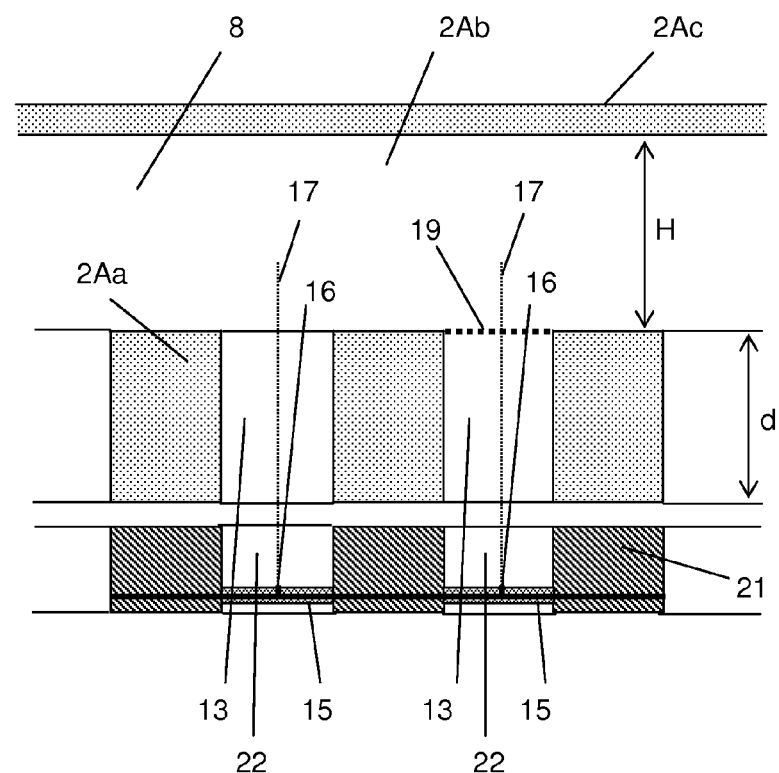
FIG. 11 is an expanded vertical sectional view showing a portion of the plasma generating electrode of the plasma processing apparatus shown in FIG. 10.

An amorphous silicon thin-film was formed on a substrate according to the same procedure as that of Example 1, except that the plasma processing apparatus E10 shown in FIGS. 10 and 11 was used on the basis of the abovementioned fourth embodiment for forming an amorphous silicon thin-film, and that power of 80 W was supplied to the plasma generating electrode 2A. The Si—H$_2$ bond concentration of the formed amorphous silicon thin-film was calculated on the basis of the same method as that of Example 1. As a result, the Si—H$_2$ bond concentration of the formed amorphous silicon thin-film was 0.1%, and it was confirmed that the formed amorphous silicon thin-film was sufficiently low in the defect density thereof.

Comparative Example 1

Figure 13:
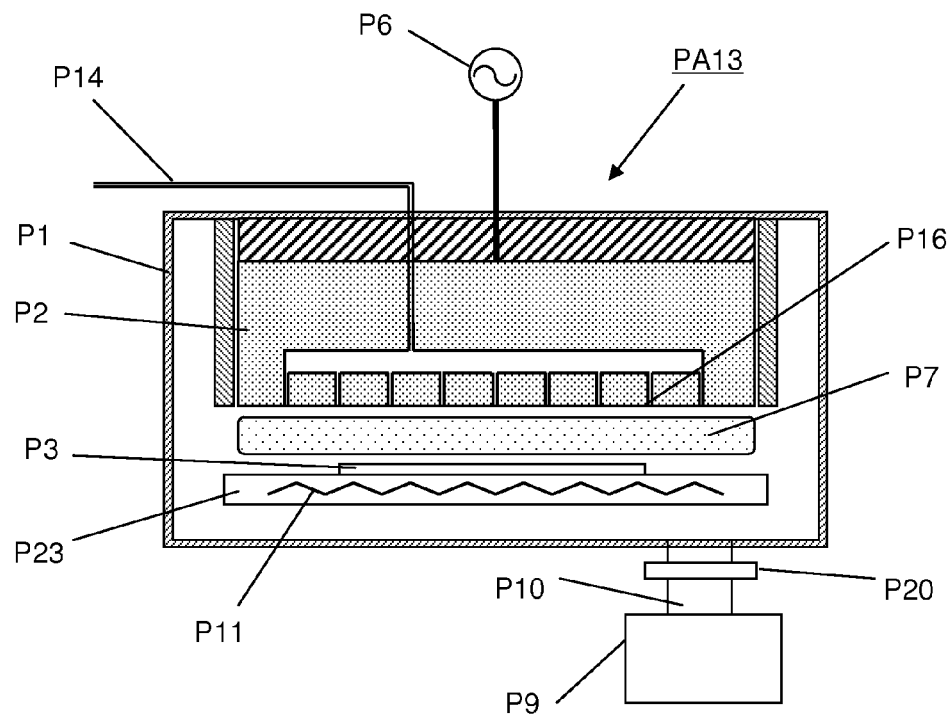
FIG. 13 is a schematic vertical sectional view showing a conventional general plasma CVD apparatus.

The conventional general parallel flat-plate type plasma CVD apparatus PA13 shown in FIG. 13 was used to form an amorphous silicon thin-film on a substrate P3. As the source gas, 50 sccm of silane gas was introduced into the vacuum vessel P1 from the gas supply ports P16 like a shower head provided in the plasma generating electrode P2 via the gas introduction pipe P14. The pressure regulating valve P20 was used to regulate the pressure in the vacuum vessel P1 to 30 Pa.

As the power source P6, a high frequency power supply of frequency 13.56 MHz was used to supply power of 30 W to the plasma generating electrode P2, for generating a plasma, thereby forming an amorphous silicon thin-film on a substrate P3. The Si—H$_2$ bond concentration of the formed amorphous silicon thin-film was calculated on the basis of the same method as that of Example 1. As a result, the Si—H$_2$ bond concentration of the obtained amorphous silicon thin-film was 1.5%, and it was confirmed that the amorphous silicon thin-film was high in the defect density thereof.

Comparative Example 2

Figure 14:
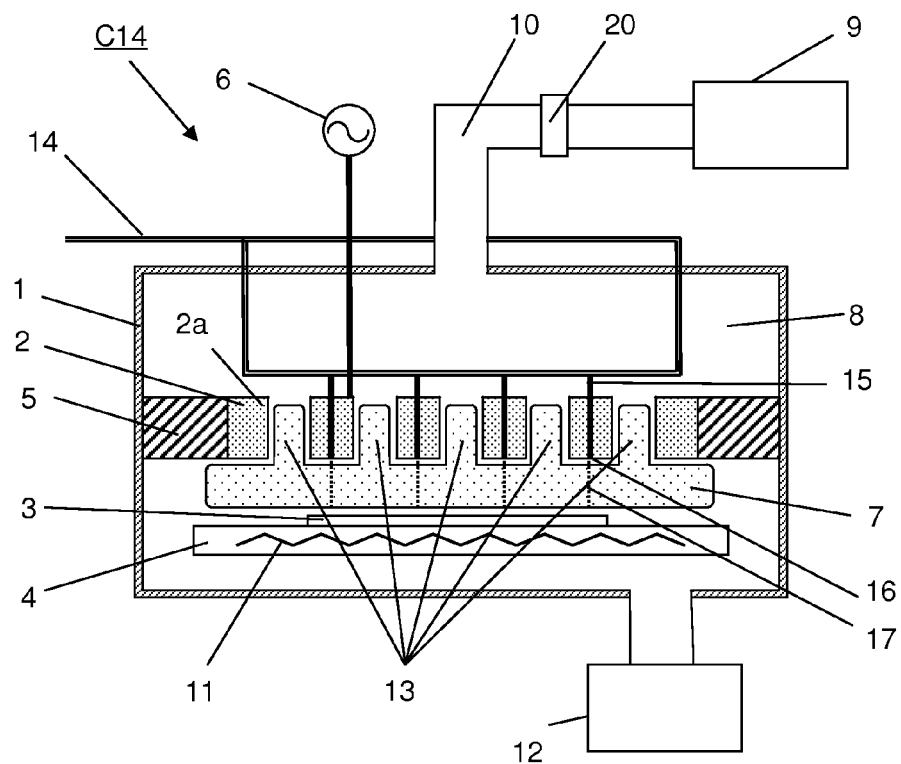
FIG. 14 is a schematic vertical sectional view showing the plasma CVD apparatus used in a comparative example.

The plasma CVD apparatus C14 shown in FIG. 14 was used to form an amorphous silicon thin-film. Compared with the plasma processing apparatus E1 shown in FIG. 1, the plasma CVD apparatus C14 has gas supply ports disposed like a conventional shower head, though the discharge electrode 2 is provided with multiple exhaust holes 12, and has the extension lines in the flow directions of gas, extending toward the substrate 3. As the source gas, 150 sccm of silane gas was introduced into the vacuum vessel 1 from the gas supply ports 16 like a shower head provided in the plasma generating electrode 2 via the gas introduction pipe 14.

An amorphous silicon thin-film was formed on the substrate 3 according to the same procedure as that of Example 1, except that power of 50 W was supplied to the plasma generating electrode 2, to generate a plasma. The Si—H$_2$ bond concentration of the formed amorphous silicon thin-film was calculated on the basis of the same method as that of Example 1. As a result, the Si—H$_2$ bond concentration of the amorphous silicon thin-film was 1.0%, and it was confirmed that the defect density of the formed amorphous silicon thin-film was not sufficiently low.

The plasma processing apparatus of the invention can be preferably used for forming a thin film having good film quality. The plasma processing apparatus of the invention can also be used as an etching apparatus or a plasma surface modifying apparatus.

REFERENCE SIGNS LIST

1: vacuum vessel
2, 2A: plasma generating electrode
2a, 2Aa: electrode plate
2Ab: lateral wall of electrode
2Ac: ceiling plate of electrode
3: substrate
4: substrate holding mechanism
5: insulating material
6: power supply
7: plasma
8: gas exhaust chamber
9: gas exhaust device
10: gas exhaust pipe
11: substrate heating mechanism
12: auxiliary gas exhaust device
13: gas exhaust hole
14: gas introduction pipe
15: gas supply pipe
16: gas supply port
17: extension line in the flow direction of gas
18: earth shield
19: end face opening region
20: pressure regulating valve
21: plasma confining electrode
22: through hole
23: earth electrode
24: plasma confining electrode heating mechanism
25: gas buffer space
C14: plasma CVD apparatus
E1, E2, E4, E6, E8, E10, E12: plasma processing apparatus
P1: vacuum vessel
P2: plasma generating electrode
P3: substrate
P6: power supply
P7: plasma
P9: gas exhaust device
P10: exhaust pipe
P11: substrate heating mechanism
P14: gas introduction pipe
P16: gas supply port
P20: pressure regulating valve
PA13: plasma CVD apparatus

The invention claimed is:

1. A plasma processing apparatus comprising:
   (a) a vacuum vessel,
   (b) a plasma generating electrode provided inside the vacuum vessel,
   (c) a substrate holding mechanism for holding a substrate positioned to face the plasma generating electrode with a gap kept against the plasma generating electrode inside the vacuum vessel,
   (d) a gas exhaust device connected with the vacuum vessel, which opens in a gas exhaust chamber formed between the plasma generating electrode and the inner wall surface of the vacuum vessel inside the vacuum vessel, in order to keep the pressure in the vacuum vessel at a reduced pressure,
   (e) a power supply connected with the plasma generating electrode, for supplying power to the plasma generating electrode, and
   (f) a gas introduction pipe connected with the vacuum vessel, for introducing source gas for plasma processing, into the inside of the vacuum vessel, wherein
   (g) the plasma generating electrode has multiple gas exhaust holes extending from the surface of the plasma generating electrode on the side facing the substrate, through the plasma generating electrode, to reach the gas exhaust chamber, in the state where the substrate is held on the substrate holding mechanism,
   (h) gas supply pipes connected with the gas introduction pipe have gas supply ports for discharging the source gas toward the insides of the multiple gas exhaust holes, and
   (i) the gas supply pipes and the gas supply ports are disposed in such a manner that the extension lines in the flow directions of the source gas discharged from the gas supply ports may intersect end face opening regions at the boundary plane between the gas exhaust holes and the gas exhaust chamber.

2. The plasma processing apparatus according to claim 1, wherein the gas exhaust chamber is provided inside the plasma generating electrode.

3. The plasma processing apparatus according to claim 1, wherein the gas supply ports are opened at the inner wall surfaces of the gas exhaust holes.

4. The plasma processing apparatus according to claim 1, wherein the gas supply pipe and the gas supply port are positioned inside the gas exhaust hole.

5. The plasma processing apparatus according to claim 1, wherein in the state where the substrate holding mechanism holds the substrate, a plasma confining electrode is provided almost in parallel to the surface of the plasma generating electrode on the side facing the substrate with a gap kept against it, and the plasma confining electrode has through holes at the positions corresponding to the multiple gas exhaust holes of the plasma generating electrode.

6. The plasma processing apparatus according to claim 5, wherein the gas supply ports are opened at the inner wall surfaces of the through holes of the plasma confining electrode.

7. The plasma processing apparatus according to claim 5, wherein the gas supply pipe and the gas supply port are positioned inside the through holes of the plasma confining electrode.

8. The plasma processing apparatus according to claim 5, wherein the plasma confining electrode has a plasma confining electrode heating mechanism and a gas buffer space is formed inside the plasma confining electrode.

9. The plasma processing apparatus according to claim 1, wherein the plasma processing of the plasma processing apparatus is chemical vapor deposition (CVD).

10. A method for producing an amorphous silicon thin-film by using the plasma processing apparatus according to claim 1, comprising keeping the pressure in the vacuum vessel at a reduced pressure by the gas exhaust device of the plasma processing apparatus, introducing a silane-containing source gas from the gas introduction pipe, supplying power from the power supply to the plasma generating electrode, in order to generate a plasma, and decomposing the source gas by the plasma generated by the plasma generating electrode, to form an amorphous silicon thin-film on the substrate.

* * * * *